United States Patent [19]
Swinehart et al.

[11] 3,981,818
[45] Sept. 21, 1976

[54] CRYSTALLINE MATERIALS

[75] Inventors: Carl F. Swinehart, University Heights; Marko Sfiligoj, South Euclid, both of Ohio

[73] Assignee: The Harshaw Chemical Company, Cleveland, Ohio

[22] Filed: Oct. 15, 1973

[21] Appl. No.: 406,585

Related U.S. Application Data

[60] Division of Ser. No. 193,206, Oct. 26, 1971, Pat. No. 3,766,080, and a continuation-in-part of Ser. No. 314,952, Oct. 9, 1963, abandoned, said Ser. No. 193,206 is also a continuation-in-part of said Ser. No. 314,952.

[52] U.S. Cl. .............................. 252/300; 23/302 R; 23/303; 23/304; 23/305 R; 350/2; 350/311
[51] Int. Cl.² .......................................... G02B 5/20
[58] Field of Search .............. 252/300; 23/302, 303, 23/304, 305; 350/2, 311

[56] References Cited
UNITED STATES PATENTS

| | | |
|---|---|---|
| 2,498,186 | 2/1950 | Stockbarger et al. ............. 423/163 |
| 2,642,335 | 6/1953 | May et al. ............................ 23/303 |
| 2,739,045 | 3/1956 | Pfann ................................... 23/293 |
| 2,966,592 | 12/1960 | Vogl et al. ............................. 350/1 |
| 3,002,811 | 10/1961 | Johnson ............................... 23/304 |
| 3,111,088 | 11/1963 | Fisk ..................................... 244/410 |

*Primary Examiner*—Benjamin R. Padgett
*Assistant Examiner*—Deborah L. Kyle
*Attorney, Agent, or Firm*—Alfred D. Lobo

[57] ABSTRACT

A composition of matter transparent to infrared rays and shock resistant which is a directionally grown, polycrystalline solidified melt of a eutectic composition comprising at least two components wherein the ratio of the index of refraction of one to the other is within the range of 1.2 to 1.0, the directionally oriented, polycrystalline mass is grown in a controlled manner by adding heat to the melt and removing the same from the solids during the solidification step, the amount of heat being added to the melt and conducted through the solidified melt being $10^3$ to $10^5$ times the latent heat of fusion of the eutectic mixture.

2 Claims, No Drawings

CRYSTALLINE MATERIALS

RELATED APPLICATIONS

This application is a division of our copending application Ser. No. 193,206 filed Oct. 26, 1971, now U.S. Pat. No. 3,766,080, which, in turn, is a continuation-in-part of our then copending application Ser. No. 314,952, filed Oct. 9, 1963 now abandoned. This application is also a continuation-in-part of our application Ser. No. 314,952, filed Oct. 9, 1963.

BACKGROUND OF THE INVENTION

This invention relates to new bodies having infrared radiation transparency, a property not possessed by other bodies of identical chemical composition. More particularly, this invention relates to a multicomponent, multiphase, polycrystalline mass of controlled grown crystals substantially free of voids, comprising at least two different solid phases in substantially continuous atomic contact with each other. The instant grown crystals which are multicomponent and multiphase are by definition also polycrystalline.

The polycrystalline bodies of the present invention comprise multiphases and multicomponents in the sense used by Willard Gibbs as extended by Smits (see Findlay, The Phase Rule, Longman Green, New York 6th Edition 1927, pp. 6, 7, and 28). In the multiphase, multicomponent polycrystaylline bodies of the present invention, the phases differ in atomic structure or lattice spacing, and the components, of which there are more than one, conform to the definition for equilibrium (Findlay supra).

Constituents which may be used to prepare the bodies of the present invention are represented by the general formula:

$$I M_m X_n$$

wherein M represents an element of Groups I, II, III, IV, V, and VII; X represents an anion; and $m$ is an integer ranging from 1–6 inclusive; n is an integer ranging from 0–6 inclusive; and wherein at least two components consisting of at least one constitutent represented by said formula are capable of forming a eutectic.

The multicomponent, multiphase, polycrystalline bodies of the present invention are prepared by conventional crystal-growing techniques, used heretofore to grow single phase, essentially monocrystalline bodies from a melt. The necessary proportions of two or more constituents, capable of forming a multicomponent eutectic, are mixed intimately and grown by any one of the well known crystal growing procedures, such as the Stockbarger-Bridgman procedure (U.S. Pat. No. 2,149,076), the Kyropoulos-Czochralski procedure [Z. Phys. Chem. 92, 219 (1917)] or the Verneuil procedure (C. R. 135, pp. 791–4, 1902).

The bodies as prepared according to the instant invention are characterized by an intimate matrix of large, visible crystals in the size range from about 100 microns to about 5 mm. in cross section and arbitrary length, generally several times the cross section limited only by the length of the ingot grown. They do not cleave, are resistant to thermal shock and impact, and approach maximum density for the overall composition.

A preferred class of multicomponent, multiphase, polycrystalline bodies may be prepared according to the present invention having good to excellent transmission of light of selected wave lengths by choosing materials having very similar refractive indexes. Depending on the composition substantial percentages of specular (collimated) transmission are observed at different wave length ranges of the spectrum. In order to obtain a significant amount of specular transmission, i.e., in excess of about 20 percent transmittance, the components of the instant composition should be chosen so that the ratio of their refractive indexes falls within the range of from 1.0 to 1.2, and preferably within the range of from 1.0 to 1.05, for the larger over the smaller. For usable diffuse transmission such as is permitted in a scintillator or fluorescent light source, the range for the ratio of refractive indexes of the separate phases can be broader, including ratios as high as 1.5 or even higher.

It has been found that the fluorides of the elements of Groups II, III, IV, V, and VI of the Periodic Table (Handbook of Chemistry of Physics, 40th Edition, page 444, Chemical Rubber Publishing Co., Cleveland, Ohio) particularly are useful as constituents for preparing the light-transmitting bodies of the present invention, especially light having wave lengths in the infrared range. Almost all of these fluorides are substantially water-insoluble and, when comprising the components of a multiphase, optically integral crystal, transmit a large amount of light, particularly in the infrared range.

It is unexpected that the bodies prepared according to the present invention are capable of transmitting collimated light in view of the fact that the identical components when fused and cast as an integral body uniformly are opaque. Bodies of the present invention which are pervious to infrared radiation may then be properly termed as being optically integral. "Optically integral" is used in the sense that there is substantially an optical coupling between the parts of the whole body providing an infinite number of light paths having much the same efficiency throughout the integral body, either where light is transmitted from one surface of the body to another, as in a window, or from a point within the body to a surface of the body as in a scintillator.

Certain of these optical bodies which transmit wave energy extremely well, especially in the infrared, may be used in many areas where single crystals cannot be used because of their intrinsic nature; the crystals may bend in a certain direction, cleave under impact, fracture with thermal shock, and the like. A preferred polycrystalline body prepared according to the present invention consists of barium fluoride and calcium fluoride, each of which constitutes a separate phase from the other within the body. These materials conduct light energy extremely well in the range of wave lengths from about 1.5 microns to about 12 microns at a thickness of 5 mm.

The light-transmitting bodies of the present invention have many advantages over the pressed optics which are prepared by hot pressing small, randomly oriented, granular crystals into an integral matrix to form an otpical window. Pressed optics are used in various areas for transmitting light because they are not susceptible to cleavage. Because of this random orientation, they are more resistant to thermal shock and impact and therefore may be used under conditions which would cause crystals to break or cleave. The pressed optics in many ways are similar to bodies of the present invention by way of their physical properties. These pressed optics, however, are limited as to their degree of purity and practically as to size. Because of high surface area in the granular mass of small crystals which is used to obtain the pressed optic, it is extremely difficult to acquire a finished product of maximum purity. The mechanical confinement of the die substantially suppresses the vaporization of almost all of the light-absorbing impurities and renders any scavenger additives useless. Moreover, because the optical prisms must be hot-pressed in a die, they are limited technologically by the size of the die and press and the ability of the die to control the density throughout the entire mass of small crystals. Various glass-forming compositions have been investigated for developing infrared transmitting bodies, but the best compositions only transmit infrared having wave lengths up to 6 microns and invariably absorb infrared radiation in the 3 micron region.

The preferred barium fluoride-calcium fluoride polycrystalline bodies of the present invention advantageously may be cut or ground into various optical shapes and used with various light detecting devices and systems which are frequently subjected to shock or other rough treatment. Their size is not influenced by the expense of making a die for each particular application. Moreover, the bodies of the present invention may be made almost any size without internal strains, internal cracks, open boundaries between components and the like, whereby the bodies may be cut, ground or otherwise formed into any shape or configuration. They are particularly useful as a nose window for wave-energy guided vehicles such as the infrared homing missiles and the like. Because of their unique physical properties, the multiphase polycrystalline bodies of the present invention particularly may be adapted for such rugged use, cooperating in a unique manner (excellent optical cooperation) with infrared detecting and guiding systems employed with such vehicles and the like.

SUMMARY OF THE INVENTION

It has been discovered that a melt of at least two components capable of forming a eutectic composition, wherein the ratio of the index of refraction of one to the other is within the range from about 1.2 to 1.0, may be directionally solidified to form a polycrystalline mass of three-dimensional elongated crystals oriented in a direction normal to the solidification front, under controlled growth conditions so that the polycrystalline mass is transparent to infrared radiation. Though the instant polycrystalline mass is grown from an essentially eutectic composition, none of the crystallites has the eutectic composition, but each elongated crystal is a crystallite of one of the phases. The controlled growth of the new composition, which has no voids at the crystallite boundaries, permits light transmission, which is not possible with casting.

PREFERRED EMBODIMENT OF THE INVENTION

As indicated hereinbefore, it is important that at least two of the constituents (compounds or elements) comprising the components used to prepare the bodies of the present invention be capable of forming a eutectic. The proportions of these constituents are not restricted to proportions close to or at the eutectic composition. However, at least 8 to 10 percent of the constituent constituting the minor phase should be used, and preferably the proportions of the constituents constituting the minor phase or the major phase should be within 15 percent by weight of the eutectic. In order to obtain an optically integral body, it is especially preferred that the proportions of these constituents be held to within about 5 percent of the eutectic and still permit one phase to start to grow before the other. It is advantageous to have a slight excess of one constituent over the proportion of that component in the eutectic.

That the proportions are not restricted to those of the eutectic is apparent from the fact that the phases within the bodies having a substantially uniform composition throughout are obtained even though there is a disproportionate evaporation of the components from the melt during the growth. There is a slight relative change in volume of the two phases, but the amount of evaporation is so small that any difference in relative volumes of the phases may be considered insignificant or inconsequential.

The small variance in composition found in bodies made according to the present invention is in apparent conflict with the Phase Rule until it is realized that the bodies are not formed under true equilibrium conditions. The Phase Rule indirectly requires that eutectics have a specific composition because at equilibrium the melt can exist only as a single composition when in contact with different solid phases equal to the number of components. In the instant situation, however, the melt is superheated and there is usually a disproportionate evaporation of constituents during growth.

The essential feature of the present invention is the growing of the instant bodies under controlled conditions. The rate at which the multiphase polycrystalline bodies of the present invention are grown depends on the temperatures of the two zones and the flow of heat through the growth interface. The rate of growth, crucible size, and the inside diameter of the crucible must be considered in determining the proper conditions necessary for obtaining a body having the desired physical characteristics. These factors are, of course, well known to those skilled in the art, and need no further discussion.

Preferably, the melt should be mixed before and continually during the progressive solidification of the melt. When the Stockbarger procedure (supra) is to be used, a positive means of stirring may be necessary because there is little convection mixing, heat being applied from above. In the Kyropoulos procedure (supra), mixing is inherent either from rotation of the solid as it is grown on the surface or from heat addition to the lower part of the melt.

Discontinuities in the materials comprising the charge move toward the heat source at a rate dependent upon vapor pressure of the material and the thermal gradient maintained in the solid. Where optical bodies are to be produced, the growth rate is especially important; these discontinuities, regardless of form, affect the light transmission characteristics. Thus, for best results, the growth rate should be several orders of magnitude slower than the flow of heat would permit. In other words, the amount of heat being conducted through the solidifying mass is several orders of magnitude greater than ($10^4 - 10^5$) the latent heat of fusion.

In melting and growing the material in a good vacuum, pressures less than 2 microns Hg absolute are preferred but pressures up to 10 mm. Hg absolute are tolerable. Atmospheres of the noble gases including argon, helium, and the like, and hydrogen, can be used with the Kyropoulos procedure. However, trace amounts of oxygen or nitrogen usually contaminate the bodies being prepared for optical purposes, especially those prepared from a fluoride-containing melt; the resulting bodies usually contain color absorption bands and light scattering imperfections.

Specific elements represented by M of Formula I particularly include aluminum, barium, cadmium, calcium, cesium, chromium, cobalt, copper, germanium, indium, iron, lead, lithium, magnesium, molybdenum, potassium, rubidium, silicon, silver, sodium, strontium titanium, zinc, zirconium, and the like. Anions advantageously useful in combination with these metals, represented by X in Formula I, particularly include hydroxyl, carbonate, sulfate, nitrate, sulfide, selenide, telluride, fluoride, chloride, bromide, iodide, oxide, cyanide, arsenide, thiocyanate, chlorate, iodate, phosphate, tungstate, and the like. The glass-forming anions, such as borate, silicate, titanate, zirconate, and the like, in general, when combined as a salt, do not form a eutectic, and therefore do not fall within that scope of the present invention.

Polycomponent systems are also considered to be within the scope of the present invention and particularly include ternary and quaternary systems comprising compounds represented by Formula I, and include those compounds made from the above-listed metals and anions. As previously mentioned, the systems must include a eutectic, and the individual phases must transmit light to have a refractive index. Other compounds which are soluble in one or more of the phases comprising the ternary, quaternary or other systems may be used also.

Specific examples of binary eutectic systems useful in preparing the multicomponent, multiphase polycrystalline bodies of the present invention are set forth in the following Table I:

TABLE I

| COMPONENT I | MOL-% II OF EUTECTIC | COMPONENT II | MELTING POINT OF MIXTURE °C. |
|---|---|---|---|
| $Sb_2S_3$ | 25 | $Sb_2O_3$ | 485 |
| LiF | 80 | LiOH | 430 |
| LiCl | 28 | LiF | 498 |
| LiBr | ~13 | LiF | 453 |
| $Li_2SO_4$ | 43 | LiF | 535 |
| $Li_2SO_4$ | 63.5 | LiCl | 478 |
| $LiNO_3$ | 11.8 | LiCl | 252 |
| $LiNO_3$ | 13 | $Li_2SO_4$ | 252 |
| $Li_2CO_3$ | 49 | LiF | 608 |
| $Li_2CO_3$ | 60 | LiCl | 506 |
| $Li_2CO_3$ | 60 | $Li_2SO_4$ | 540 |
| $Li_2CO_3$ | 98 | $LiNO_3$ | 250 |
| NaF | 61 | LiF | 652 |
| NaCl | 33.5 | NaF | 676 |
| NaBr | 23 | NaF | 642 |
| NaI | 18 | NaF | 603 |
| NaI | 37 | NaCl | 570 |
| NaI(Tl) | ~37 | NaCl | 570 |
| KF | 50 | LiF | 492 |
| KF | 40 | NaF | 710 |
| KCl | 26.5 | NaF | 648 |
| KCl | 45 | KF | 606 |
| KBr | 21 | NaF | 650 |
| KBr | 40 | KF | 576 |
| KI | 12 | NaF | 631 |
| KI | 43.5 | NaCl | 514 |
| KI | 34 | KF | 544 |
| KI | 47.5 | KCl | 598 |
| RbF | 50 | LiF | 450 |
| RbF | 33 | NaF | 644 |
| RbCl | 46 | NaCl | 541 |
| RbCl | 57 | RbF | 545 |
| CsCl | 58.5 | LiCl | 332 |
| CsCl | 35 | NaCl | 493 |
| MgO | 60 | BeO | 1855 |
| $MgBr_2$ | 59 | NaBr | 431 |
| MgS | 33 | MgO | 1600 |
| CaO | 66 | BeO | 1470 |
| CaO | 45 | MgO | 2280 |
| $CaF_2$ | 86 | LiF | 765 |
| $CaF_2$ | 68 | NaF | 810 |
| $CAF_2$ | 37 | MgO | 1340 |
| $CaF_2$ | 57 | $MgF_2$ | 945 |
| $CaCl_2$ | 47 | NaCl | 500 |
| SrO | 50 | MgO | 1935 |
| $SrCL_2$ | 50 | NaCl | 565 |
| $BaF_2$ | 65 | NaF | 825 |
| $BaF_2$ | 72 | KF | 750 |
| $BaF_2$ | 92 | KCl | 740 |
| $BaF_2$ | 79 | RbF | 665 |
| $BaCl_2$ | 61 | NaCl | 640 |
| $BaCl_2$ | 21 | $CaF_2$ | 791 |
| $BaBr_2$ | 60 | NaBr | 600 |
| $ZrO_2$ | 49 | MgO | 2070 |
| $ZrO_2$ | 50 | $Al_2O_3$ | 1885 |
| $ThO_2$ | 65 | BeO | 2200 |
| $ThO_2$ | 60 | CaO | 2300 |
| $FeCl_2$ | 44.5 | $CaCl_2$ | 592 |
| $FeCl_2$ | 50 | $SrCl_2$ | 541 |
| $FeCl_3$ | 46 | NaCl | 158 |
| FeS | 23 | CaS | 1120 |
| FeS | 6.5 | MnS | 1164 |
| CoO | 42 | CaO | 1425 |
| $Ni_2S$ | 29.6 | $Na_2S$ | 615 |
| $Ni_3S_2$ | 41.4 | $Na_2S$ | 647 |
| $Cu_2O$ | 47 | CaO | 1140 |
| CuCl | 27 | NaCl | 314 |
| CuI | 57 | CuCl | 284 |
| $Cu_2S$ | 93.5 | $Ni_2S$ | 575 |
| $Cu_2S$ | 67 | $Ni_3S_2$ | 728 |
| $cu_2S$ | 88.7 | CuCl | 391 |
| AgCl | 30 | KCl | 318 |
| AgCl | 25.1 | KBr | 320 |
| AgCl | 40 | RbCl | 251 |
| AgCl | 9 | $MgCl_2$ | 455 |
| AgCl | 30 | CsCl | 258 |
| AgCl | 54 | CuCl | 260 |
| AgCl | 27 | $Cu_2S$ | 318 |
| AgBr | 32 | KBr | 285 |
| AgI | 40 | NaI | 394 |
| AgI | 43.4 | CuCl | 216 |
| AgI | 53 | AgCl | 264 |
| $Ag_2S$ | 59.6 | AgCl | 376 |
| $Ag_2S$ | 91 | AgBr | 392 |
| $ZnF_2$ | — | NaF | 682 |
| ZnS | 93.6 | FeS | 1180 |
| ZnS | 90.4 | $Ag_2S$ | 807 |
| AgI | 20.8 | KI | 254 |
| AgI | 28.5 | KI | 244 |

The Examples of several ternary systems which may be grown into the multiphase polycrystalline bodies of the present invention are set forth in the following Table II:

TABLE II

| COMPONENT I | COMPONENT II | COMPONENT III | EUTECTIC MOL-% II | EUTECTIC MOL-% III | MELTING POINT OF EUTECTIC-°C |
|---|---|---|---|---|---|
| LiF | NaF | KF | 10 | 44 | 454 |
| LiF | NaF | RbF | 7 | 53 | 435 |
| LiF | NaF | $CaF_2$ | 35 | 10 | 615 |
| $LiNO_3$ | $NaNO_3$ | $Ca(NO_3)_2$ | 43 | 17 | 170.3 |
| $LiNO_3$ | $KNO_3$ | $Ca(NO_3)_2$ | 59 | 9 | 124 |
| NaF | NaCl | NaI | 32 | 54 | 530 |
| KF | KCl | KI | 35 | 40 | 488 |

The starting materials which are used to prepare the multiphase polycrystalline bodies of the present invention should be fairly pure and substantially free from water. Various standard procedures known to those skilled in the art for purifying the starting materials of the present invention may be used. After the reactants are upgraded sufficiently, they are then blended or mixed in the desired proportions and grown according to any of the methods previously mentioned. Inasmuch as the majority of the starting materials used to prepare the bodies of the present invention are salts, a simple preparation from the appropriate base, such as a hydroxide or carbonate, and the appropriate acid or acid salt may be used. Reaction may be effected in an aqueous or anhydrous medium according to methods well known to those skilled in the art. Of course, scrap crystal ingots or the naturally occurring mineral may be used. Moreover, when they are grown for optical purposes, it is preferred that a scavenger be used. Particular scavengers useful with the alkaline earth metal fluorides are lead fluoride and the vapors of manganese trifluoride and cobalt trifluoride, Teachings of their use will be found in U.S. Pat. No. 2,498,186 to Stockbarger and U.S. Pat. No. 3,282,614 to Sfiligoj and Swinehart, respectively.

In order that those skilled in the art may better understand how the present invention can be carried into effect, the following examples are given by way of illustration, and not by way of limitation. All parts and percentages are by weight unless otherwise specified.

EXAMPLE I

Optical scrap barium fluoride (367 parts) 60.8 mole percent and optical scrap calcium fluoride (100 parts) 37.2 mole percent is mixed with lead fluoride (10 parts) 1.2 mole percent and charged into a graphite crucible. The crucible is then covered with a lid provided with one-sixteenth inch vent hole. Manganese trifluoride (3 parts) 0.8 mole percent is placed in a small cup affixed to the underside of the lid and provided with a small aperture to provide gaseous communication between the cup and the crucible. The furnace (Stockbarger type) is then evacuated to a pressure of less than 0.1 mm. Hg absolute, and heat is applied over an 18-hour period until all gassing ceases and the charge fuses into a melt and until the temperature reaches about 1300° C. After setting the temperature controls down to growth as indicated by the location of the solid liquid interface at the temperature gradient zone, the crucible is lowered slowly into a cooler zone at 4 mm. per hour and continued for 24 hours. The elevator is stopped and the temperature slowly brought to room temperature over a period of 24 hours. After cooling, the ingot is removed from the crucible and laterally sliced perpendicular to the longitudinal axis into a series of discs 5 mm. thick. After polishing, each of the discs is tested for its optical characteristics using a Perkin Elmer Model 21 or infracord 137 spectrophotometer.

EXAMPLE II

Example I is repeated, using a charge comprising (500 parts) 68.0 mole percent optical scrap barium fluoride, (100 parts) 30.6 mole percent optical scrap calcium fluoride, (12 parts) 1.2 mole percent lead fluoride, and (1 part) 0.2 mole percent cobalt trifluoride in the cup.

EXAMPLE III

Example I is repeated, using a charge comprising (190 parts) 60.2 mole percent of precipitated barium fluoride, (52 parts) 37.0 mole percent of selected fluorspar, (10 parts) 2.3 mole percent of lead fluoride, and (1 part) 0.5 mole percent of manganese trifluoride in the cup.

EXAMPLE IV

Example I is repeated, using a charge comprising (367 parts) 61.3 mole percent optical scrap barium fluoride, (10 parts) 37.5 mole percent optical scrap calcium fluoride, and (10 parts) 1.2 mole percent of high quality lead fluoride. There was no manganese trifluoride placed in the cup at the underside of the cover.

All of the compositions prepared according to the foregoing examples (I–IV) have physical properties falling within the following specifications.

| PHYSICAL PROPERTIES | |
|---|---|
| Specular (collimated) Transmission: | |
| Usable | - 1.5 to 11.4 microns, over 10% for 5 mm. thickness |
| Excellent | - 3 to 9 microns, over 60%; .25 to 1.5 microns, over 20% in visible range for 5 mm. thickness |
| Optical Absorption Bands | - None |
| Appearance | - White, translucent, marble-like |
| Density | - 4.50 to 4.44 gm./cc. |
| Hardness (Mohs Scale) | - 4.5 (higher than $CaF_2$ or $BaF_2$) |
| Cleavage | - None |
| Fracture | - Irregular to concoidal |
| Strength and Rigidity | - Comparable with porcelain or marble |
| Thermal Shock Resistance | - 5 × 15 × 20 mm. slabs show no change upon repeated quenching (10 cycles) from 300° C. into ice water or onto dry ice |
| Thermal Expansion | - 25 × $10^{-8}$/°C. |
| Solubility | - less than 2 parts per thousand in water at 30° C., none in organic solvents |

EXAMPLE V

Example 1 is repeated, except that the crucible is stopped after two-thirds of the melt has been solidified into a multiphase polycrystalline mass of the present invention. The furnace is then allowed to cool to room temperature, permitting heat to be withdrawn from the melt through the walls of the crucible, and consequently allowing the upper portion of the melt to solidify as a cast mass. The resulting ingot is then cut laterally into thin portions perpendicular to the longitudinal axis and tested for infrared transmission.

By comparison the optical integrity of a preferred multicomponent, multiphase polycrystalline body (barium fluoride-calcium fluoride) of the present invention becomes significant. Crystals of either barium fluoride or calcium fluoride are well known optical materials; they transmit light of various wave lengths extremely well. When these two materials are fused together, cast (solidified as set forth in Example V), cut to a 5 millimeter thick body and polished to form a window, the window substantially is opaque, transmitting little if any collimated light, especially in the infrared below 12 microns.

As set forth in Example V, part of the same melt was cast by moving the melt into a cooling zone while the remainder was held in the crucible and grown to form a crystal ingot. This grown material and the sound part of the casting were cut and polished to form 5 mm. test plates.

The infrared curve of an optical body grown according to Example I shows excellent transmission of infrared from about 1.5 to about 11.5 microns for an optical window 5 mm. thick. Moreover, these bodies made therefrom, when polished, transmit between 80 percent to about 90 percent of the infrared in the range of from about 2 to over 8 microns.

EXAMPLE VI

When Example I is repeated using (40 parts) 8.5 mole percent strontium fluoride added to the barium fluoride 55.7 mole percent, calcium fluoride 34.0 mole percent, lead fluoride 1.1 mole percent and manganese trifluoride 0.7 mole percent, a body having good optical characteristics is obtained.

EXAMPLE VII

When Example I is repeated, using (533 parts) 17.5 mole percent optical scrap calcium fluoride and (9467 parts) 82.5 mole percent purified calcium iodide prepared as below, a polycrystalline mass is obtained having a matrix of large scintillation crystals optically coupled to large crystals of calcium fluoride.

Preparation of Calcium Iodide

In a suitable vessel of glass, stainless steel, or platinum, hydriodic acid (47 percent solution) 790 parts is added to calcium carbonate (215 parts) stoichiometrically in excess of the calcium, boiled to remove $CO_2$, and made alkaline with calcium oxide. The resulting reaction mass in the form of a slurry is filtered for insolubles and made acid with additional 47 percent aqueous hydrogen iodide to a pH below 1. The filtrate is boiled to concentrate the solution through a continually rising boiling range to 146° C. The resulting highly concentrated liquor was cooled to 5° C. to form calcium iodide hexahydrate in crystalline form. The mother liquor is poured off and the crystals are spread loosely in an inert tray of quartz or a resinous material, such as polytetrafluoroethylene, to a depth of approximately 1 inch. The filled tray is then placed in a vacuum drying oven equipped with a vapor trap cooled with dry ice. The oven is then evacuated and pumping continued over a period of 24 to 48 hours, with no heat applied, until a pressure of 0.1 mm. Hg absolute or less is attained. The calcium iodide is then heated slowly to about 75° to 80° C. over an interval of 40 to 60 hours, and held at this temperature for approximately 24 hours, or until a pressure of about 0.1 to 0.03 mm. Hg absolute is attained as measured by a Pirani-type vacuum gauge.

EXAMPLE VIII

When Example I is repeated, using (18.5 parts) 36.9 mole percent optical scrap sodium chloride and (80.6 parts) 67.8 mole percent sodium iodide, (0.9 part) 0.3 mole percent thallium iodide, a body comprising a matrix of scintillation crystals similar to that obtained according to Example VIII obtained.

EXAMPLE IX

When Example I is repeated, using (100 parts) 37.1 mole percent calcium fluoride and (367 parts) 60.6 mole percent barium fluoride, (10 parts) 1.19 mole percent fluoride, (3 parts) .078 mole percent manganese trifluoride and (3 parts) .032 mole percent europium trifluoride trihydrate, a body comprising a matrix of scintillation crystals similar to that obtained according to EXAMPLE VII is obtained.

Windows and other optical bodies may be made from the multicomponent, multiphase polycrystalline bodies prepared according to the present invention using conventional grinding techniques. Examples of such techniques include (1) abrasive wheels having diamonds or other abrasives impregnated or bonded in the surface thereof, (2) mechanically driven copper or other soft metal cutter blades running in slurries of an abrasive such as silicon carbide or emery in a liquid, and (3) ultrasonic driven steel or Monel cutters in similar slurries of abrasives.

The windows or optical bodies of the present invention may be affixed to a supporting structure using conventional methods employed in mounting crystals or glass windows. Because of their relative ruggedness, these bodies may be clamped around a peripheral flange integral with the window, or they may be bonded with an adhesive or cementitious material, such as an epoxy resin. Fused silver chloride has been exceptionally adaptable as a bonding agent for crystals (see J. Kervitsky, Report of N.R.L. Progress, February 1960).

The optical bodies of the present invention particularly are used advantageously as windows for devices which are responsive to infrared radiation. Generally, these devices are based on a simple circuit including an element in series with an impressed voltage wherein the element changes its resistance when exposed to infrared radiation.

Because of their resistance to shock and because they are not handicapped by cleavage problems, the infrared transmitting bodies of the present invention are particularly useful as windows in missiles guided by systems responsive to infrared radiation coming from a target. Such missiles or vehicles include steering systems such as those set forth in U.S. Pat. Nos. 2,826,380 and 2,897,369, which act to guide the missile to its intended destination.

An infrared homing missile may advantageously use a window made from a multiphase polycrystalline body prepared according to the present invention.

The optical bodies of the present invention may be used advantageously with other devices depending upon infrared radiation to actuate a primary or auxiliary system of the device. They may be used in devices which convert infrared light to visible light, such as a snooperscope. They may be used with infrared cameras, either as protective windows or lenses for the camera. They are also used advantageously as lenses for telescopes, eliminating the need for reflector mirrors that are difficult to streamline or adapt to certain geometrical alignments of lens, tube, and sensing element. Mosaics or matrixes of scintillator materials and/or thermoluminescent materials with non-active components are readily made according to the present invention. In this form, the bodies of the present invention are advantageously applied as fluoroscopes, light sources and the like, wherein the exciting radiation can come from without or a doping or radioactive constituent of the body itself.

While specific examples of the invention have been set forth hereinabove, it is not intended that the invention be limited solely thereto, but to include all of the variations and modifications falling within the scope of the appended claims.

We claim:

1. A process for making an infrared transmitting non-cleaving, cooled and solidified melt comprising the steps of mixing two infrared-transparent solid components capable of forming a eutectic in proportions to yield approximately the eutectic mixture, heating the mixture to form a melt of the two solid phases, solidifying the melt in a controlled manner by adding heat to the melt and removing same from the solids during said solidification step, the amount of heat being added to the melt and conducted through the solidifying melt is $10^3$ to $10^5$ times the latent heat of fusion of said eutectic mixture, and cooling the solid mixture.

2. The process according to claim 1 further characterized in that each component is made up of a metal and an anion, said metal having been chosen from the group consisting of aluminum, barium, cadmium, calcium, cesium, chromium, cobalt, copper, iron, lithium, magnesium, molybdenum, potassium, rubidium, silver, sodium, strontium, titanium, zinc, and zirconium, and said anion having been chosen from the group consisting of hydroxyl, carbonate, sulfate, nitrate, sulfide, fluoride, chloride, bromide, iodide, cyanide, thiocyanate, chlorate, iodate, phosphate and tungstate.

* * * * *